(12) United States Patent
Vetter

(10) Patent No.: US 6,794,064 B2
(45) Date of Patent: Sep. 21, 2004

(54) HARD COATING COATED PARTS

(75) Inventor: Jörg Vetter, Bergisch Gladach (DE)

(73) Assignee: Metaplas Ionon Oberflaechenveredelungstechnik GmbH, Bergisch Gladbach (DE)

( * ) Notice: Subject to any disclaimer, the term of this patent is extended or adjusted under 35 U.S.C. 154(b) by 0 days.

(21) Appl. No.: 10/301,178

(22) Filed: Nov. 20, 2002

(65) Prior Publication Data

US 2003/0124391 A1 Jul. 3, 2003

(51) Int. Cl.$^7$ ................................. B32B 15/00
(52) U.S. Cl. ................... 428/698; 428/336; 428/325; 428/697; 428/699
(58) Field of Search ................... 428/336, 325, 428/697, 698, 699

(56) References Cited

U.S. PATENT DOCUMENTS

| | | | | |
|---|---|---|---|---|
| 4,436,830 | A | * | 3/1984 | Andreev et al. |
| 5,981,049 | A | * | 11/1999 | Ohara et al. |
| 6,284,356 | B1 | * | 9/2001 | Kiriyama |
| 6,586,122 | B2 | * | 7/2003 | Ishikawa et al. |
| 2001/0031347 | A1 | | 10/2001 | Vetter et al. |

FOREIGN PATENT DOCUMENTS

| | | | |
|---|---|---|---|
| EP | 0872575 A2 | | 10/1998 |
| EP | 1132498 A1 | | 9/2001 |
| EP | 1219723 | * | 7/2002 |
| JP | 06346077 | * | 12/1994 |
| JP | 07-237010 | * | 9/1995 |
| JP | 09-300105 | * | 11/1997 |
| JP | 11-131215 | * | 5/1999 |
| JP | 2000-038653 | * | 2/2000 |
| JP | 2001254187 | | 9/2001 |
| WO | 00/24947 | * | 5/2000 |

* cited by examiner

*Primary Examiner*—Archene Turner
(74) *Attorney, Agent, or Firm*—Townsend and Townsend and Crew LLP

(57) ABSTRACT

The invention relates to hard coating coated parts which are coated with a hard coating containing the elements Al, Ti, Cr, N, O with a chemical composition of each element of $Al_a Ti_b Cr_c N_w O_{100-w}$ in the range of $30 \leq a \leq 70$, $30 \leq b \leq 70$, $0.5 \leq c \leq 20$ a+b+c=100 at % and $70 \leq w \leq 99\%$. The invention aims at a superior adhesion between the coating and the substrate without a reduction of the wear resistance, of the oxidation resistance and of the friction properties, but improving every one of the coating properties to a achieve a stable behavior under heavy-duty cutting, resulting in a long lifetime. Therefore, it is proposed that the full width at half maximum (FWHM) $2\theta$ of the (200)x-ray diffraction peak is larger than 0.4° and smaller than 0.7°.

11 Claims, No Drawings

HARD COATING COATED PARTS

BACKGROUND OF THE INVENTION

This invention is about wear-resistant parts having improved solid-state friction properties or lubrication capability, a higher wear resistance, an improved oxidation behavior and a superior adhesion property between the coating and the substrate.

In the fields of cutting tools, molds and mechanical components, it is popular to coat various hard coatings or layers in order to have superior wear resistance, oxidation behavior and friction properties. The typical coatings TiN and TiCN have a good wear resistance, but still they have problems in fitting the need for a sufficient oxidation resistance. Furthermore, TiAlN-based coatings proposed by published Japanese patent Hei 7-310173 have good wear resistance and oxidation behavior but the friction property is still insufficient.

CrN-, CrCN-based coatings have good friction properties, but they have a lower coating hardness and lower wear resistance.

As shown above, conventional coatings show inferiority in wear resistance, oxidation behavior or friction properties and still have some problems in various applications. In order to provide better friction properties, it was proposed to coat MoS-based thin films on the surface of hard coatings. However both the wear resistance and often also the adhesion of these types of thin films are poor; thus they do not provide sufficient improvement.

In general, the conventional coatings do not have the maximum adhesion force between the substrate and the coating; often a partial peeling-off of the coating takes place in heavy-duty cutting and therefore a stable cutting cannot be realized.

Because such conventional coatings still have some problems with top layers other than MoS-based layers, Japanese Laid-Open patent Hei 11-156992 proposed to coat a CrN-based coating on the surface of a TiAlN-based layer. However this coating type does not show a sufficient wear resistance, due to the limitation of the entire coating thickness.

The present invention aims at a superior adhesion between the coating and the substrate without a reduction of the wear resistance, of the oxidation resistance or of the friction properties, but improving every one of the coating properties to achieve a stable behavior under heavy-duty cutting, resulting in a long lifetime.

In order to solve the above-described optimization problem of the coating properties, in the present invention Ti, Al, Cr, N are necessary elements and, by adding oxygen to these elements, special optimized hard coatings can be created.

In addition, by optimizing the growth rate of the coating it is possible to deposit coatings characterized by a superior adhesion.

In the coating composition, Ti and Al contribute as wear-resistant elements, while Cr helps to improve the friction properties. By adding oxygen to the TiAlCrN coating, a further improvement, both of the oxidization-resistance and of the friction properties, is created.

In order to improve both the adhesion and the wear resistance, an optimization of the growth rate is carried out that should enable a continuous growth between the crystal lattice of WC grain of cemented carbide substrates and the hard coating, resulting in an at least partial epitaxial growth. The results are hard coatings with superior adhesion to the substrate, and therefore a longer cutting life under heavy-duty cutting is achievable.

First, studies of properties of hard coatings with different chemical composition showed the following effect: the oxidation behavior is improved when Cr is added to TiAlN. In case of TiAlN, it is well known that due to higher temperature load under oxygen attack Al diffuses to the surface of the layer and creates an aluminum oxide layer, resulting in the effect that the oxygen penetration from outside is suppressed and therefore an improvement of the oxidation behavior can be achieved. However, in this case, especially if a thermal and/or mechanical shock is acting on the cutting tool, then the aluminum oxide layer can easily flake off, because a very porous titanium oxide layer is generated underneath the aluminum oxide layer during oxidation. The same phenomena are occurring in the application of the hard coatings to different cutting tools or other tools like dies or molds or others.

It was proved that porous Ti oxide created underneath Al oxide turns from titanium oxide, in case of an AlTiN coating, into a TiCr oxide by adding Cr into the hard layer. It was observed that the TiCr oxide forms very dense layers. This dense oxide layer supports the aluminum oxide created on the top of the hard coating, resulting in a sufficient adhesion combined with an improved oxidation behavior.

The second effect of the Cr addition is the improvement of the friction properties.

The friction values of TiAlN hard layers against steel are in the range of 0.7–0.8.

The friction values were measured to be in the range of 0.3–0.6 if Cr is added. This is a significant improvement of the friction behavior.

This friction coefficient depends on the volume of Cr addition.

However, if the volume of Cr addition is too high, then the coating hardness decreases, resulting in inferior wear resistance, and therefore it is better to establish an upper limit on the volume of Cr addition.

It is confirmed that the Cr addition can improve the friction properties and oxidation behavior of the TiAlN-based coatings, but it has been found that the Cr addition is not enough for the optimization of the hard coating properties. Thus further improvement is recognized when oxygen is added.

The effect of oxygen addition results in a drastic improvement of oxidation behavior as well as in friction properties.

It is considered that the reason for the improvement of the oxidation behavior is that the oxygen addition inside the coating results in the effect that the grain structure becomes finer, the coating itself becomes more dense and the grain boundaries become more dense, resulting in the effect that the speed of oxygen diffusion of the oxygen from the hard layer surface inside the layer is reduced.

The improvement of the friction properties has not yet been analyzed in detail, but it is considered that affinity with steel becomes lower by adding oxygen.

The second effect of oxygen addition is that wear resistance is improved by an improvement of the adhesion of the hard coating due to lowering of the residual compressive stress in coating.

The adhesion of the hard coating is very important especially in heavy-duty cutting or in the field of forging dies. There is a trend of increasing wear caused by small peeling-off of layers, and if a large peeling-off takes place then the end of the lifetime is suddenly reached.

For demonstration of the improved adhesion, selected measurements using a standard scratch test unit are given now. The maximum loads of AlTiCrN-based coatings are in the range of 60 N–80 N, while it is improved to more than 100 N by adding oxygen.

If the volume of oxygen addition increases, the wear resistance will be improved due to the above-mentioned improvements of the oxidation behavior, friction properties and adhesion of the hard coating. However, the coating hardness is decreased if the oxygen content becomes too high, resulting in an inferior abrasive wear resistance. Accordingly, it is important and desirable to make multi-layer coatings consisting of single layers with optimized elements that contribute to the improvement both of the oxidation behavior and the friction properties and of single layers with optimized elements that contribute to an improvement of the abrasive wear resistance. The advantages of the above two kinds of single layers are then combined in the multi-layer coating. It is possible to adjust the friction properties and wear resistance not only by the variation of the oxygen volume in multi-layer coatings but also by the optimization of the Cr content.

Because extremely high mechanical impact forces are acting in the heavy-duty cutting field, it is not sufficient to optimize the chemical composition of the hard coatings regarding the friction properties, the oxidation behavior and wear resistance. If the adhesion of the coating is not optimized, as sufficient stable operation of the cutting tools cannot be realized.

SUMMARY OF THE INVENTION

The invention comprises in brief hard coating coated parts which are coated with a hard coating containing the elements Al, Ti, Cr, N, O with a chemical composition of each element of $Al_aTi_bCr_cN_wO_{100-w}$ in the range of $30 \leq a \leq 70$, $30 \leq b \leq 70$, $0.5 \leq c \leq 20$ a+b+c=100 at % and $70 \leq w \leq 99$%, characterized in that the full width at half maximum (FWHM) 2θ of the (200) x-ray different peak is larger than 0.4° and smaller than 0.7°.

DESCRIPTION OF THE PREFERRED EMBODIMENTS

The inventors of the present invention concentrated research especially on this problem and found out that the growth rate of the hard coatings greatly affects the adhesion properties of the coatings on the cemented carbide tools.

It is desirable that the growth rate is as low as possible. It has been observed by transmission electron microscope that the coating grows epitaxially at the WC grains of the cemented carbide substrate if the growth rate of the coating is low enough. The epitaxial growth of the hard coating at the WC grains results in the strongest bonding state between the WC grains and the growing coating.

Concerning the hard coating morphology, it was found that conventional columnar crystallization has a good wear resistance if cemented carbide inserts are coated. It was found out that finer columnar morphologies or block-like columnar morphologies (i.e. that had been vertically divided from the finer columnar morphologies) have a better wear resistance.

It is also important to notice that the grain diameter can be influenced both by controlling the growth rate of the coating and the growth temperature in the direction perpendicular to the substrate-coating interface. For instance, it is possible to deposit coatings with a finer columnar morphology in direction to the coating surface by decreasing the substrate temperature at a certain growth time.

As mentioned above, it is possible to improve the wear resistance by making the entire coating with finer morphologies; however this tends to increase slightly the residual compressive stress in the coating.

The method of generating finer grains toward the coating surface can give a better wear resistance, because it is possible to control the level of the increase of the residual compressive stress so as to avoid a decrease of the adhesion level. Experiments showed that both the wear resistance and oxidation behavior are improved if the coating has an outer single layer that is characterized by a morphology showing an extremely fine grain size, also often termed as an amorphous-like state. Thus, the best solution in view of the integral coating properties is to avoid columnar growth at the top of the coating.

One explanation for that finding is the reduction of the oxygen diffusion into the coating caused by the dense grain boundaries of the amorphous-like morphology, resulting in a suppression of oxidation progress.

In the following, an explanation will be given why the numerical values of different characteristic values of the coating properties are limited.

It has been found that the growth rate influences the full width at half maximum (FWHM) 2θ of the XRD peaks. If the coatings are deposited by applying lower growth rates, the full width at half maximum (FWHM) 2θ of the (200) XRD peak tends to get smaller.

A lower full width at half maximum (FWHM) 2θ of the (200) XRD peak indicates the existence of the above-mentioned epitaxial growth. In order to achieve a high level of epitaxial growth, the growth rate should be within the range of 0.1 μm/h–0.8 μm/h, resulting in typical 2θ values of the (200) XRD peak in the range of 0.4°–0.7°.

If growth rates greater than of 0.8 μm/h are used, then the 2θ value exceeds 0.7°, combined with the effect that nearly no epitaxial growth is generated, resulting in a decrease of the adhesion level of the coating. The problem to apply extremely low growth rates to adjust a 2θ of the (200) XRD peak to less than 0.4° is of a practical nature because it will take about one day to obtain the required coating thickness of the inserts for cutting applications. Thus this will give not an economical solution.

To solve the problem in an economical way, the following procedure was carried out to combine the positive effects of the low growth rates in the range of 0.1 μm/h–0.8 μm/hr, which are not sufficiently large in view of the economy and practice of the coating process, with the requirement to adjust economical and practical growth rates. The initial growth should be low enough to generate the epitaxial growth of the coating at the WC grains of the substrate. Then the growth rate will be accelerated gradually or stepwise. It can be mentioned that the above method is the most economical way to achieve both superior adhesion properties and high enough growth rate for industrial use.

Concerning the coating composition, it must discussed that an Al content less than 30 at % does not give a sufficient oxidation behavior, while an Al content greater that 70 at % is inferior because grains of a AlN phase having a hexagonal crystal structure are generated in the coating, resulting in a weakening of the coating strength.

If the Ti content is smaller than 30 at % the wear resistance of the coating becomes worse, while a Ti content greater than 70 at % reduces the oxidation behavior of the coating. If the Cr content is lower than 0.5 at % porous Ti oxide is created during oxidation in the coating, and thus the low Cr content does not contribute to the improvement of the oxidation behavior, while a Cr content greater than 20 at % generates a drop of the coating hardness combined with a decrease of the wear resistance.

If the oxygen content is smaller than 1 at % (oxygen plus nitrogen equal 100 at %) then the oxygen does not contribute to the improvement of oxidation behavior, friction properties and adhesion, while an oxygen content greater than 30 at % results in a drop of the coating hardness.

A single layer coating can function sufficiently well, but coatings of the multi-layer type with at least two or more single layers combine single layers with various characteristics, resulting in outstanding functional properties.

A number of single layers within a total coating thickness greater than 1000 is not recommended, because each layer thickness becomes too thin and occasionally a special thin film state in the form of a super lattice is generated. Also the residual stress is higher, resulting in a decrease of the adhesion level. If each single layer has the same thickness within the coating, then the thickness should not be smaller than 5 nm. Otherwise, coatings with single layers thicker than 2000 nm behave similarly to coatings deposited in the form of a single layer.

The crystal orientation of the coating depends on the coating conditions. If the coatings are deposited with a relatively low energy, it is possible to deposit coatings that are strongly oriented to (200) plane. If the deposition of the coatings is carried out by using relatively high energies, which are often applied in vacuum arc deposition processes of TiN, the coating is oriented to (111) plane.

It was confirmed that in case of the deposition with a low energy the coating density is improved, resulting both in a better oxidation behavior and wear resistance. Accordingly, it can be said that when the (200) plane intensity of the XRD peak is stronger than that of the (111) plane, superior oxidation behavior and wear resistance are obtained.

The crystal orientation does not affect the friction properties so much. However, if extremely low energies are used, then the (200) plane intensity might be 20 times greater than that of intensity of diffraction, resulting in the effect that the adhesion properties tend to aggravate.

The level of the compressive residual stress in the coatings depends on the coating conditions. If the coating condition generates a compressive residual stress greater than 3.5 GPa then the adhesion properties are negatively influenced. The stress level should be lower than 3.5 GPa.

It is also important to note that the coatings described in the present invention can have the same trends in generating the above-described property fields when the coating deposition is carried out by plasma-enhanced deposition methods like Vacuum Arc Ion Plating, Sputtering Electron Beam-Evaporation, Plasma Assisted CVD and production methods that combine two or more of the mentioned methods.

In the following, a favorable embodiment of this invention is explained hereunder together with the presentation of illustrating examples. Both the tools with coatings of the present invention and comparison tools with reference coatings were produced in an Arc Ion Plating machine. The composition of metallic components in the coatings AlTiCr was adjusted by adjustment of the metal composition of the cathode targets that were used as evaporation sources.

The oxygen content was adjusted by adding a certain amount of oxygen to the nitrogen reactive gas during the coating process. The oxygen flow was adjusted and was switched on and off to generate multi-layers by variation of the oxygen content in the coating. In order to deposit coating consisting of single layers with different metal contents, cathode targets with different metal compositions were evaporated.

The crystal orientation is adjusted by coating conditions. The (200) orientated coatings were deposited using the following coating conditions: 70 V bias voltage, reactive gas pressure 1 Pa. The (111) orientated coatings were produced using the following conditions: 200 V bias voltages, reactive gas pressure 0.5 Pa.

It should be mentioned that the ratio $|(200)/|(111)$ depends slightly also both from the coating composition and the oxygen content.

The coating conditions were controlled and tested. It was found out by electron microscopy inspections of the coating morphology that at a deposition temperature of 450° C. and a reactive gas pressure of 2 Pa a conventional columnar morphology of the coating was generated, at a deposition temperature of 400° C. and a reactive gas pressure of 2 Pa a fine columnar morphology was generated, at a deposition temperature of 400° C. and a reactive gas pressure of 0.5 Pa a block-like columnar morphology was generated, and at a deposition temperature of 350° C. and a reactive gas pressure of 0.5 Pa an amorphous-like morphology of the coatings was generated.

To adjust the level of the compressive stress in the coating at a deposition temperature of 450° C. and a reactive gas pressure of 2 Pa the bias voltage was varied in the range of 20 V–250V.

In addition to the variation of the deposition temperature, of the reactive gas pressure and of the bias voltage, the discharge current applied at the cathode targets was varied in the range of 50–70 A for a single evaporator. The coating growth rate was in the range of 0.2 $\mu$/h–0.7 $\mu$/hr.

The examples of 16, 17 of the present invention shown in Chart 1 were deposited under the following special condition. The deposition of the coating started with a relatively slow growth rate of about 0.8 $\mu$m/h during the first half coating thickness followed by a relatively fast growth rate of 1.7 $\mu$/h with arc current 120 A. The adjustment of the half value width of the x-ray diffraction peak was carried out by the adjustment of arc current value. Each reference sample for comparison was deposited with the following coating conditions: deposition temperature 450° C., reactive gas pressure 2 Pa, bias voltage 40V–100V, arc current 100 A.

Chart 1

In Chart 1, examples of the present invention and comparison examples are summarized.

The coating thicknesses of examples of this invention as well as in comparison examples are all 3000 nm–3200 nm.

Chart 2

In Chart 2, measured coating properties of examples of the present invention and comparison examples are shown. The full widths at half maximum (FWHM) 2θ of the XRD peaks were measured by a standard x-ray diffraction unit. The oxidation behavior was investigated by the following procedure. The test samples were oxidized at 900° C. in open air. During oxidation, the weight increase per time unit was measured. The friction properties were analyzed by measuring the friction coefficient against carbon steel. The compressive residual stress was measured by a bending method. The Vickers hardness was measured using a nano indentation unit at a load of 1 g.

It is very clear that examples of this invention are superior to comparison examples in every point.

Chart 3

In Chart 3 the tool lifetimes of examples of the present invention and comparison examples are shown for end mill cutting under the conditions below.

| | |
|---|---|
| Tool material | 90WC-9.5 Co-0.5 Cr, WC grain diameter. 0.8 μm. |
| Tool | 6 cutting blades, diameter 8 mm end mill |
| Work piece material | SKD 11 (HRC 63) |
| Cutting speed | 100 m/min. |
| Depth of cut | 8 mm × 0.8 mm |
| Feed rate | 50 μm/cutting edge |
| Dry or wet | Dry cutting |

The criterion for the end of the tool lifetime is that cutting length at which the end mill is broken into two pieces. In any event, tool lifetimes of the examples of the present invention are longer than those of the comparison examples.

In Chart 3 the tool lifetimes of examples of the present invention and of comparison examples are shown for drilling operation. The drill force is the result of the measurement of the 10th hole at the initial stage of drilling.

Tool life was judged as being when the drill was broken.

| | |
|---|---|
| Tool material | 91.5WC-8 Co-0.5 Cr, WC grain diameter 0.8 μm |
| Work piece material | DIN 1.2344 (HRC 42) |
| Drill diameter | 8 mm |
| Cutting speed | 80 m/min. |
| Feed rate | 0.2 mm/rev. |
| Depth of hole | 32 mm |
| Dry or wet | Dry cutting |

It is self-evident that examples of the present invention have a remarkably longer lifetime than the comparison examples.

In the third test, cemented carbide inserts of the present invention and comparison cemented carbide inserts were investigated by a cutting test. The results are also described in Chart 3. In case of front milling, oxidation behavior is important because the cutting speed is high.

| | |
|---|---|
| Tool material | P30 grade cemented carbide alloy |
| Insert type | SEE1203 (clearance angle is 5°) |
| Work piece material | 1.2344 (HRC 22) |
| Cutting speed | 400 m/min. |
| Cutting depth | 1 mm |
| Feed rate | 0.1 mm/cutting edge |
| Dry or wet | Dry cutting |

The criterion of the tool life end was the cutting time until average flank wear (VB) reached 0.4 mm.

It is obvious that the examples of the present invention show a remarkable improvement of the tool life against the comparison examples.

TiAlCrON-based multi-layer coatings at the base of TiAlN coatings modified by addition of Cr and oxygen show both an improvement of the oxidation behavior and of the friction properties without degrading wear resistance. Furthermore, also an improvement of the coating adhesion was seen due to lower levels of the compressive residual stress, resulting in a better performance of different tools in high-speed dry cutting.

Furthermore, by adjusting the growth rate an epitaxial growth of the coating on the WC grains of the cemented carbide substrate was observed. The examples of the present invention showed that coatings showed superior adhesion at the parts. Even in heavy-duty cutting, no peeling-off of the coating takes place and therefore a stable cutting is achievable. The same or similar effects might help to improve the tool performance in other application fields like hot forging.

CHART 1

| | number | first layer | second layer | No. of layer | remarks |
|---|---|---|---|---|---|
| examples of this invention | 1 | 50Al40Ti10Cr-5095N | — | 1 | Al, Ti, Cr, O, N comp. |
| | 2 | 55Al35Ti10Cr-5095N | — | 1 | " |
| | 3 | 35Al55Ti10Cr-5095N | — | 1 | " |
| | 4 | 65Al32Ti3Cr-5095N | — | 1 | " |
| | 5 | 33Al64Ti3Cr-5095N | — | 1 | " |
| | 6 | 40Al35Ti25Cr-5095N | — | 1 | " |
| | 7 | 50Al40Ti10Cr-2098N | — | 1 | " |
| | 8 | 50Al40Ti10Cr-10090N | — | 1 | " |
| | 9 | 50Al40Ti10Cr-25075N | — | 1 | " |
| | 10 | 50Al40Ti10Cr-5095N | 50Al40Ti10Cr-10090N | 20 | multi-layer with |
| | 11 | " | " | 500 | different oxygen |
| | 12 | " | " | 1000 | volume |
| | 13 | 50Al40Ti10Cr-5095N | 40Al35Ti25Cr-5095N | 20 | multi-layer: different content of Cr, Ti, Al |
| | 14 | 50Al40Ti10Cr-5095N | 60Al30Ti10Cr-5095N | 20 | composition control |
| | 15 | 50Al40Ti10Cr-5095N | 50Al40Ti10Cr-10090N | 20 | (see Chart 2) |
| | 16 | " | 50Al40Ti10Cr-10090N (growth rate up) | 20 | |
| | 17 | " | 50Al40Ti10Cr-10090N (growth rate up) | 20 | |
| | 18 | " | 50Al40Ti10Cr-10090N (growth rate up) | 20 | |
| | 19 | " | 50Al40Ti10Cr-10090N (growth rate up) | 20 | |
| | 20 | " | 50Al40Ti10Cr-10090N (growth rate up) | 20 | |
| | 21 | " | 50Al40Ti10Cr-10090N (growth rate up) | 20 | |

CHART 1-continued

| | number | first layer | second layer | No. of layer | remarks |
|---|---|---|---|---|---|
| | 22 | " | 50Al40Ti10Cr-10090N (growth rate up) | 20 | |
| | 23 | " | 50Al40Ti10Cr-10090N (growth rate up) | 20 | adjustment of residual compression stress |
| | 24 | " | 50Al40Ti10Cr-10090N (growth rate up) | 20 | |
| | 25 | " | 50Al40Ti10Cr-10090N (growth rate up) | 20 | adjustment of half value width |
| | 26 | " | 50Al40Ti10Cr-10090N (growth rate up) | 20 | |
| | 27 | " | 50Al40Ti10Cr-10090N (growth rate up) | 20 | |
| comparison examples | 28 | TiN | — | 1 | other composition |
| | 29 | Ti-50N50C | — | 1 | |
| | 30 | 50Al50Ti-N | — | 1 | |
| | 31 | TiN(500 nm) | 50Al50TiN(2500 nm) | 2 | |
| | 32 | 65Al35Ti-N | — | 1 | |
| | 33 | 65Al35Ti-N | 100 nm MoS$_2$ | 2 | |
| | 34 | 65Al35Ti-N(2000 nm) | CrN(1000 nm) | 2 | |
| | 35 | 50Al50Ti-70N30C | — | 1 | |
| | 36 | TiN | 50Al50TiN | 20 | |
| | 37 | 25Al40Ti35Cr-5095N | — | 1 | Cr |
| | 38 | 30Al35Ti35Cr-5095N | — | 1 | Cr |
| | 39 | 50Al40Ti10Cr-35065N | — | 1 | Oxygen |
| | 40 | 50Al40Ti10Cr-5095N | 50Al40Ti10Cr-50050N | 20 | Oxygen |
| | 41 | " | " | 1500 | Oxygen |
| | 42 | 5Al40Ti10Cr-5095N | — | 1 | |
| | 43 | " | " | 1 | |

CHART 2

| | number | hardness (Hv) | half value width (degree) | I(200)/I(111) | weight increase by oxygen (mg/min) | friction coefficient | stress (Gpa) | coating morphology substrate side | coating morphology surface side |
|---|---|---|---|---|---|---|---|---|---|
| examples of this invention | 1 | 2550 | 0, 56 | 5, 11 | 1, 97 | 0, 33 | 2, 1 | Columnar morphology | |
| | 2 | 2500 | 0, 57 | 4, 12 | 1, 01 | 0, 32 | 2, 0 | | |
| | 3 | 2600 | 0, 59 | 6, 22 | 3, 03 | 0, 37 | 2, 5 | | |
| | 4 | 2430 | 0, 62 | 3, 11 | 1, 21 | 0, 33 | 2, 7 | | |
| | 5 | 2590 | 0, 62 | 4, 14 | 3, 18 | 0, 31 | 2, 5 | | |
| | 6 | 2480 | 0, 60 | 2, 81 | 0, 95 | 0, 31 | 2, 1 | | |
| | 7 | 2580 | 0, 66 | 5, 12 | 1, 87 | 0, 36 | 2, 4 | | |
| | 8 | 2500 | 0, 54 | 2, 65 | 1, 64 | 0, 35 | 1, 9 | | |
| | 9 | 2430 | 0, 55 | 2, 21 | 1, 68 | 0, 32 | 1, 5 | | |
| | 10 | 2520 | 0, 51 | 4, 13 | 1, 69 | 0, 34 | 1, 9 | | |
| | 11 | 2550 | 0, 53 | 3, 22 | 1, 23 | 0, 31 | 1, 6 | | |
| | 12 | 2600 | 0, 55 | 2, 64 | 1, 31 | 0, 31 | 1, 4 | | |
| | 13 | 2560 | 0, 52 | 5, 13 | 1, 54 | 0, 31 | 1, 8 | | |
| | 14 | 2530 | 0, 53 | 4, 33 | 1, 14 | 0, 32 | 1, 6 | | |
| | 15 | 2590 | 0, 54 | 3, 45 | 1, 33 | 0, 31 | 2, 0 | A | B |
| | 16 | 2610 | 0, 55 | 3, 22 | 1, 21 | 0, 30 | 2, 5 | B | B |
| | 17 | 2630 | 0, 52 | 3, 11 | 0, 65 | 0, 21 | 2, 7 | A | amorphoous |
| | 18 | 2740 | 0, 52 | 2, 98 | 0, 66 | 0, 23 | 2, 9 | B | |
| | 19 | 2600 | 0, 51 | 3, 33 | 1, 22 | 0, 32 | 2, 1 | A | block |
| | 20 | 2630 | 0, 58 | 3, 05 | 1, 06 | 0, 31 | 2, 7 | B | like |
| | 21 | 2700 | 0, 53 | 2, 02 | 1, 04 | 0, 33 | 2, 8 | block | |
| | 22 | 2780 | 0, 52 | 2, 56 | 0, 63 | 0, 23 | 2, 9 | like | amorphous |
| | 23 | 2430 | 0, 58 | 4, 93 | 1, 67 | 0, 31 | 0, 5 | A | A |
| | 24 | 2590 | 0, 61 | 0, 89 | 1, 78 | 0, 30 | 4, 0 | B | B |
| | 25 | 2680 | 0, 42 | 0, 91 | 1, 64 | 0, 30 | 0, 5 | columnar morphology | |
| | 26 | 2560 | 0, 52 | 1, 87 | 1, 99 | 0, 31 | 2, 1 | | |
| | 27 | 2480 | 0, 68 | 3, 01 | 3, 67 | 0, 36 | 2, 9 | | |
| comparison examples | 28 | 2160 | 0, 64 | 0, 25 | 85, 28 | 0, 87 | 1, 4 | | |
| | 29 | 2980 | 0, 61 | 0, 22 | 98, 13 | 0, 29 | 4, 2 | | |
| | 30 | 2700 | 0, 61 | 2, 43 | 11, 67 | 0, 85 | 2, 4 | | |
| | 31 | 2700 | 0, 58 | 0, 56 | 12, 55 | 0, 85 | 2, 0 | | |
| | 32 | 2750 | 0, 55 | 3, 22 | 8, 05 | 0, 89 | 2, 1 | | |
| | 33 | 2720 | 0, 56 | 3, 22 | 22, 23 | 0, 11 | 2, 1 | | |
| | 34 | 2240 | 0, 53 | 3, 22 | 15, 67 | 0, 29 | 2, 2 | | |
| | 35 | 3010 | 0, 67 | 2, 56 | 25, 44 | 0, 65 | 4, 2 | | |
| | 36 | 2450 | 0, 51 | 2, 33 | 56, 81 | 0, 88 | 2, 1 | | |
| | 37 | 2280 | 0, 55 | 4, 35 | 1, 54 | 0, 36 | 1, 9 | | |

CHART 2-continued

| number | hardness (Hv) | half value width (degree) | I(200)/ I(111) | weight increase by oxygen (mg/min) | friction coefficient | stress (Gpa) | coating morphology substrate side | coating morphology surface side |
|---|---|---|---|---|---|---|---|---|
| 38 | 2300 | 0, 58 | 5, 22 | 1, 35 | 0, 33 | 1, 8 | | |
| 39 | 1940 | 0, 50 | 8, 72 | 0, 71 | 0, 22 | 1, 8 | | |
| 40 | 1980 | 0, 52 | 6, 25 | 0, 94 | 0, 22 | 1, 6 | | |
| 41 | 1990 | 0, 53 | 5, 99 | 0, 72 | 0, 21 | 1, 5 | | |
| 42 | 2360 | 0, 75 | 3, 22 | 6, 32 | 0, 32 | 1, 0 | | |
| 43 | 2100 | 0, 88 | 2, 23 | 9, 34 | 0, 30 | 0, 6 | | |

*Coating morphology: A columnar morphology, B fine columnar morphology

CHART 3

| | number | cutting length of ends mills [m] | drilling force [N] | number of holes | life time of insert [h] |
|---|---|---|---|---|---|
| examples of this invention | 1 | 55 | 120 | 730 | 1, 24 |
| | 2 | 65 | 112 | 900 | 1, 69 |
| | 3 | 46 | 120 | 556 | 1, 20 |
| | 4 | 74 | 124 | 980 | 1, 82 |
| | 5 | 50 | 126 | 678 | 1, 31 |
| | 6 | 58 | 108 | 832 | 1, 34 |
| | 7 | 50 | 127 | 665 | 1, 21 |
| | 8 | 59 | 118 | 721 | 1, 49 |
| | 9 | 54 | 128 | 650 | 1, 34 |
| | 10 | 66 | 120 | 813 | 1, 67 |
| | 11 | 70 | 120 | 964 | 1, 78 |
| | 12 | 78 | 119 | 1003 | 2, 00 |
| | 13 | 57 | 111 | 809 | 1, 33 |
| | 14 | 60 | 115 | 847 | 1, 44 |
| | 15 | 69 | 122 | 890 | 1, 72 |
| | 16 | 72 | 121 | 893 | 1, 86 |
| | 17 | 75 | 124 | 932 | 1, 93 |
| | 18 | 78 | 120 | 933 | 2, 00 |
| | 19 | 82 | 119 | 941 | 2, 09 |
| | 20 | 88 | 115 | 956 | 2, 21 |
| | 21 | 91 | 123 | 953 | 2, 01 |
| | 22 | 78 | 121 | 882 | 1, 89 |
| | 23 | 56 | 122 | 957 | 2, 43 |
| | 24 | 78 | 123 | 604 | 1, 23 |
| | 25 | 75 | 120 | 950 | 2, 58 |
| | 26 | 58 | 125 | 748 | 1, 36 |
| | 27 | 40 | 129 | 604 | 1, 03 |
| comparison examples | 28 | 2 | 195 | 21 | 0, 11 |
| | 29 | 4 | 101 | 43 | 0, 24 |
| | 30 | 27 | 189 | 257 | 0, 75 |
| | 31 | 25 | 185 | 298 | 0, 77 |
| | 32 | 31 | 186 | 358 | 0, 81 |
| | 33 | 34 | 175 | 348 | 0, 75 |
| | 34 | 29 | 115 | 211 | 0, 45 |
| | 35 | 35 | 165 | 278 | 0, 71 |
| | 36 | 14 | 190 | 86 | 0, 33 |
| | 37 | 50 | 109 | 364 | 0, 85 |
| | 38 | 56 | 110 | 484 | 0, 98 |
| | 39 | 12 | 105 | 212 | 0, 15 |
| | 40 | 11 | 115 | 179 | 0, 54 |
| | 41 | 17 | 121 | 145 | 0, 58 |
| | 42 | 34 | 121 | 498 | 1, 01 |
| | 43 | 22 | 118 | 231 | 0, 57 |

What is claimed is:

1. Hard coating coated parts which are coated with a hard coating containing the elements Al, Ti, Cr, N, O with a chemical composition of each element of $Al_aTi_bCr_cN_wO_{100-w}$ in the range of $30 \leq a \leq 70, 30 \leq b \leq 70, 0.5 \leq c \leq 20$ a+b+c=100 at % and $70 \leq w \leq 99\%$, characterized in that the full width at half maximum (FWHM) $2\theta$ of the (200)x-ray diffraction peak is larger than 0,4° and smaller than 0.7°.

2. Hard coating coated parts according to claim 1, characterized in that the coatings are deposited as one single layer.

3. Hard coating coated parts according to claim 1, characterized in that the hard coatings consist of a number of single layers within the total layer thickness in the range of 2 single layers up to 1000 single layers.

4. Hard coating coated parts according to claim 1, characterized in that the thickness of each single layer has a minimum of 5 nm up to a maximum of 2000 nm.

5. Hard coating parts according to claim 1, characterized in that the hard coatings have a crystal structure of the NaCl type.

6. Hard coating coated parts according to claim 5, supposing that the intensity of the x-ray diffraction peak from (111) plane is I(111) and the intensity of the x-ray diffraction peak from (200) plane is I(200), characterized in that the ratio of I(200)/I(111) is in the range value between 1,0 and 20.

7. Hard coating coated parts according to claim 1, characterized in that the coating morphology shows a crystal grain structure that is columnar or block-like columnar.

8. Hard coating coated parts according to claim 1, characterized in that the coating shows a variation of the morphology perpendicular to the substrate interface indicated by a decrease of the grain diameter towards the coating surface.

9. Hard coated parts according to claim 1, characterized in that the coating morphology shows an amorphous-like state of the top surface layer.

10. Hard coating coated parts according to claim 1, characterized in that the coatings have a level of the residual compressive stress in between 0.5 GPa–3.5 GPa.

11. Hard coating coated parts according to claim 1, characterized in that the coating is deposited with a low growth rate at the interface between the substrate and the coating followed by a higher growth rate of the coating towards the coating surface.

* * * * *

UNITED STATES PATENT AND TRADEMARK OFFICE
CERTIFICATE OF CORRECTION

PATENT NO. : 6,794,064 B2
DATED : September 21, 2004
INVENTOR(S) : Jorge Vetter

It is certified that error appears in the above-identified patent and that said Letters Patent is hereby corrected as shown below:

<u>Title page,</u>
Item [65], Prior Publication Data, kindly insert -- EP 01128227.4 Nov. 28, 2001 --.

Signed and Sealed this

Sixteenth Day of August, 2005

JON W. DUDAS
*Director of the United States Patent and Trademark Office*